United States Patent
Huang et al.

(10) Patent No.: US 10,824,252 B1
(45) Date of Patent: Nov. 3, 2020

(54) TOUCHPAD MODULE

(71) Applicant: PRIMAX ELECTRONICS LTD., Taipei (TW)

(72) Inventors: Tai-Sou Huang, Taipei (TW); Shao-Ju Yen, Taipei (TW)

(73) Assignee: PRIMAX ELECTRONICS LTD., Taipei (TW)

(*) Notice: Subject to any disclaimer, the term of this patent is extended or adjusted under 35 U.S.C. 154(b) by 0 days.

(21) Appl. No.: 16/578,930

(22) Filed: Sep. 23, 2019

(30) Foreign Application Priority Data

Jul. 26, 2019 (TW) .............................. 108126602 A

(51) Int. Cl.
*G06F 3/0354* (2013.01)
*H01H 36/00* (2006.01)
*H05K 1/18* (2006.01)

(52) U.S. Cl.
CPC ......... *G06F 3/03547* (2013.01); *H01H 36/00* (2013.01); *H05K 1/181* (2013.01); *H05K 2201/10053* (2013.01)

(58) Field of Classification Search
CPC ..... G06F 3/03547; G06F 3/041; H01H 36/00; H05K 1/181; H05K 2201/10053
See application file for complete search history.

(56) References Cited

U.S. PATENT DOCUMENTS

| | | | |
|---|---|---|---|
| 5,977,888 A * | 11/1999 | Fujita | H01H 13/705 341/34 |
| 2002/0056321 A1 * | 5/2002 | Fallak | G05G 9/047 73/488 |
| 2010/0079404 A1 * | 4/2010 | Degner | G06F 3/044 345/174 |
| 2011/0141052 A1 * | 6/2011 | Bernstein | G06F 3/0416 345/174 |
| 2012/0056730 A1 * | 3/2012 | Ujiie | G06F 3/038 340/12.22 |
| 2015/0185769 A1 * | 7/2015 | Takata | G06F 1/169 345/173 |
| 2016/0162147 A1 * | 6/2016 | Xie | G06F 1/169 345/173 |

* cited by examiner

*Primary Examiner* — Hong Zhou
(74) *Attorney, Agent, or Firm* — WPAT, PC

(57) ABSTRACT

A touchpad module for an electronic device is provided. The touchpad module includes a fixing frame, a touch member, a switch member and an adjusting element. The touch member is installed within an opening of the fixing frame. The switch member is installed on the touch member. The switch member includes a first magnetic element. The adjusting element is accommodated within an adjusting hole of the fixing frame. The adjusting element includes a second magnetic element corresponding to the first magnetic element. Moreover, like poles of the first magnetic element and the second magnetic element face each other. Consequently, a travelling distance of the touch member is adjusted according to a repulsive force between the first magnetic element and the second magnetic element.

12 Claims, 3 Drawing Sheets

TOUCHPAD MODULE

FIELD OF THE INVENTION

The present invention relates to the field of a touchpad module, and more particularly to a touchpad module for an electronic device.

BACKGROUND OF THE INVENTION

A touchpad is an input module that allows the user's finger to press or slide on a smooth panel to control the operation of the electronic device. Since the touchpad is very thin, the touchpad is usually applied to a notebook computer, a smart phone, a personal digital assistant (PDA) or any other appropriate electronic device.

Generally, a touchpad module is a stack structure of plural material layers. For example, these material layers include a covering plate, a circuit board and a supporting structure. Since each material layer has a specified tolerance, the tolerances of the stacked structure may influence the travelling distance of the touch member of the touchpad module.

For overcoming the drawbacks of the conventional technologies, there is a need of providing an improved touchpad module. Consequently, the travelling distance of the touch member of the touchpad module is not influenced by the tolerance of the stack structure.

SUMMARY OF THE INVENTION

The present invention provides a touchpad module with a calibrating and adjusting device for calibrating the tolerance about the stack structure of a touch member. Consequently, the travelling distance of the touch member is not influenced by the tolerance of the stack structure of the touch member.

In accordance with an aspect of the present invention, a touchpad module for an electronic device is provided. The touchpad module includes a fixing frame, a touch member, a switch member and an adjusting element. The fixing frame includes a top cover and a base plate. The top cover has an opening. The base plate is located under the top cover and connected with the top cover. The base plate has an adjusting hole. The touch member is movably installed within the opening of the top cover. The switch member is installed on a bottom surface of the touch member. The switch member includes a first magnetic element. The adjusting element is accommodated within the adjusting hole of the base plate. The adjusting element includes a second magnetic element corresponding to the first magnetic element. Moreover, like poles of the first magnetic element and the second magnetic element face each other. While the adjusting element is adjusted, the adjusting element is moved relative to the base plate. Consequently, a travelling distance of the touch member is adjusted according to a repulsive force between the first magnetic element and the second magnetic element.

In an embodiment, the touch member includes a circuit board and a covering plate, and the covering plate is located over the circuit board.

In an embodiment, an orthogonal projection area of the circuit board is larger than an orthogonal projection area of the covering plate. Moreover, a periphery region of a top surface of the circuit board is contacted with a bottom surface of the top cover.

In an embodiment, the switch member includes a switch element, an elastic element and a protective layer. The switch element is installed on a bottom surface of the circuit board through a surface-mount technology. The switch element includes a switch contact point. The elastic element is disposed on the switch element, and aligned with the switch contact point. The protective layer has a first surface and a second surface, which are opposed to each other. The elastic element and the switch element are covered by the first surface of the protective layer. The first magnetic element is disposed on the second surface of the protective layer.

In an embodiment, the switch element further includes an accommodation space. The elastic element is disposed within the accommodation space. The switch contact point is located at a middle region of the accommodation space.

In an embodiment, the elastic element is a metal dome or a rubber dome.

In an embodiment, the protective layer includes a first covering part and a second covering part, which are connected with each other. The elastic element is covered by the first covering part. A portion of the switch element is covered by the second covering part.

In an embodiment, the adjusting element includes a driving body, and the driving body is inserted into the adjusting hole. A first end of the driving body is located near the switch member. The second magnetic element is installed on the first end of the driving body.

In an embodiment, the driving body has an external thread structure, and the adjusting hole has an inner thread structure corresponding to the external thread structure. The driving body is rotatable relative to the base plate through the external thread structure and the inner thread structure.

In an embodiment, the driving body further includes a driving recess, and the driving recess is formed in a second end of the driving body. The second end of the driving body is opposed to the first end of the driving body.

In an embodiment, the first magnetic element and the second magnetic element are permanent magnets.

In an embodiment, the electronic device is a notebook computer, a keyboard, a smart phone, a personal digital assistant, a writing tablet or a graphics tablet.

The technology of the present invention has the following benefits. The touchpad module of the present invention is capable of adjusting the travelling distance of the touch member through the repulsive force between the first magnetic element of the switch member and the second magnetic element of the adjusting element. Since the travelling distance of the touch member is adjusted, the tolerance about the stack structure of the touch member is calibrated. That is, the travelling distance of the touch member is not influenced by the tolerance of the stack structure of the touch member. Moreover, while the touch member is pressed, the switch member is compressed and subjected to deformation in response to the non-contact repulsive force between the magnetic elements. When compared with the conventional technology of using the contact-type external force to push the switch member, the action of the switch member in response to non-contact repulsive force can reduce the abrasion of the switch member and extend the use life of the switch member.

The above objects and advantages of the present invention will become more readily apparent to those ordinarily skilled in the art after reviewing the following detailed description and accompanying drawings, in which:

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1:
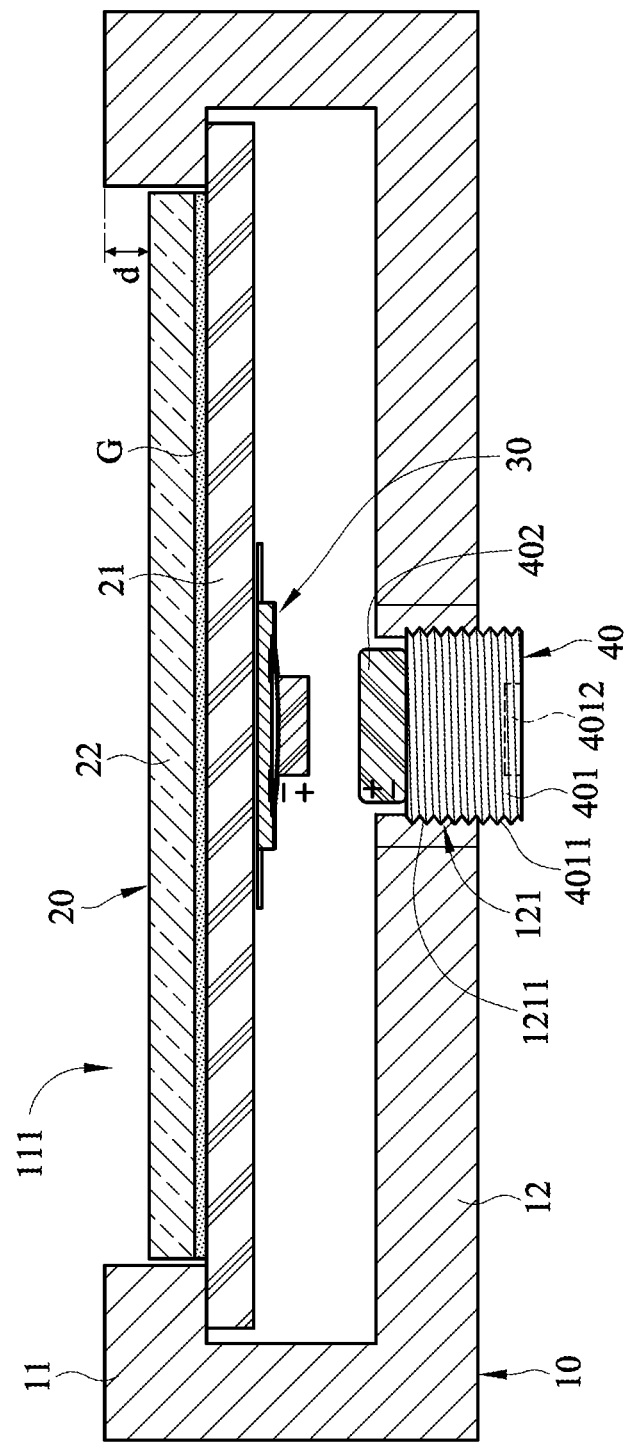
FIG. 1 is a schematic cross-sectional view illustrating a touchpad module according to an embodiment of the present invention.

Please refer to FIG. 1. FIG. 1 is a schematic cross-sectional view illustrating a touchpad module according to an embodiment of the present invention. The touchpad module 1 is applied to an electronic device. An example of the electronic device includes but is not limited to a notebook computer, a keyboard, a smart phone, a personal digital assistant (PDA), a writing tablet or a graphics tablet. In an embodiment, the touchpad module 1 comprises a fixing frame 10, a touch member 20, a switch member 30 and an adjusting element 40.

The fixing frame 10 comprises a top cover 11 and a base plate 12. The base plate 12 is located under the top cover 11, and connected with the top cover 11. The top cover 11 has an opening 111. The base plate 12 has an adjusting hole 121.

The touch member 20 is movably installed within the opening 111 of the top cover 11. For example, the touch member 20 is connected with the top cover 11 through a hinge structure (not shown) or an elastic connection structure (not shown). Consequently, the touch member 20 within the opening 111 can be swung relative to the top cover 11 or moved upwardly or downwardly along a vertical direction. The touch member 20 comprises a circuit board 21 and a covering plate 22. The covering plate 22 is located over the circuit board 21. The switch member 30 is disposed on a bottom surface of the circuit board 21. In this embodiment, a pressure sensitive adhesive (PSA) layer G is arranged between the circuit board 21 and the covering plate 22. The circuit board 21 and the covering plate 22 are combined together through the pressure sensitive adhesive layer G. Moreover, the orthogonal projection area of the circuit board 21 is larger than the orthogonal projection area of the covering plate 22, and the orthogonal projection area of the covering plate 22 is nearly equal to the orthogonal projection area of the opening 111. Consequently, the periphery region of the top surface of the circuit board 21 is contacted with the bottom surface of the top cover 11, and there is a gap d between the top surface of the covering plate 22 and the top surface of the top cover 11. In an embodiment, the covering plate 22 is made of ceramic material or glass material. It is noted that the material of the covering plate 22 is not restricted. For example, the covering plate 22 is made of sapphire crystal.

The adjusting element 40 is accommodated within the adjusting hole 121 of the base plate 12. In an embodiment, the adjusting element 40 comprises a driving body 401 and a second magnetic element 402. The second magnetic element 402 is a permanent magnet. The driving body 401 has a first end and a second end. The first end of the driving body 401 is located near the switch member 30. The second magnetic element 402 is installed on the first end of the driving body 401. Moreover, an external thread structure 4011 is formed on an outer surface of the driving body 401. The second end of the driving body 401 is opposed to the first end of the driving body 401. A driving recess 4012 is formed in the second end of the driving body 401. An inner thread structure 1211 corresponding to the external thread structure 4011 is formed on an inner surface of the adjusting hole 121. When the driving body 401 is inserted into the adjusting hole 121, the driving body 401 is rotatable relative to the base plate 12. Consequently, the driving body 401 is movable relative to the base plate 12 back and forth. The driving recess 4012 has a linear shape, a cross shape, an asterisk shape, a tetragonal shape, a hexagonal shape, a star shape or a club shape.

Figure 2A:
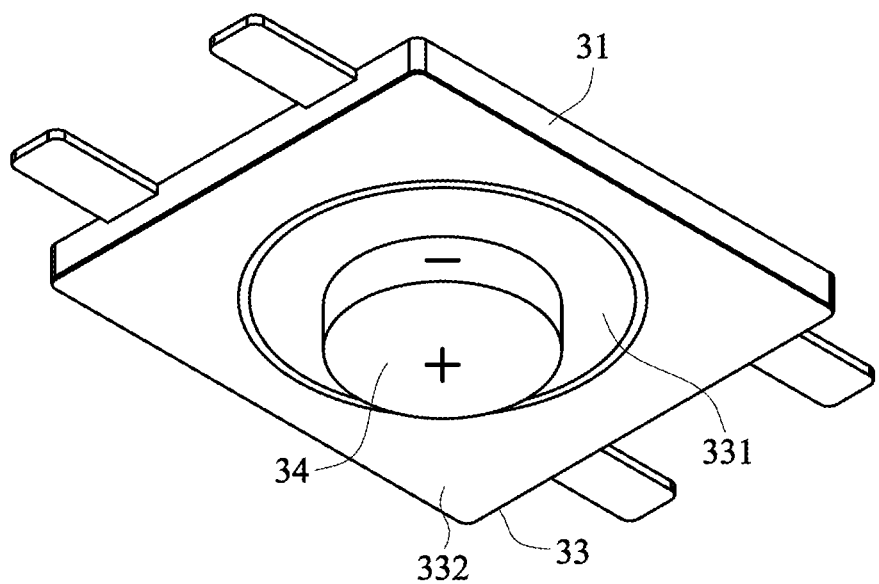
FIG. 2A is a schematic perspective view illustrating a switching module of the touchpad module according to the embodiment of the present invention.
Figure 2B:
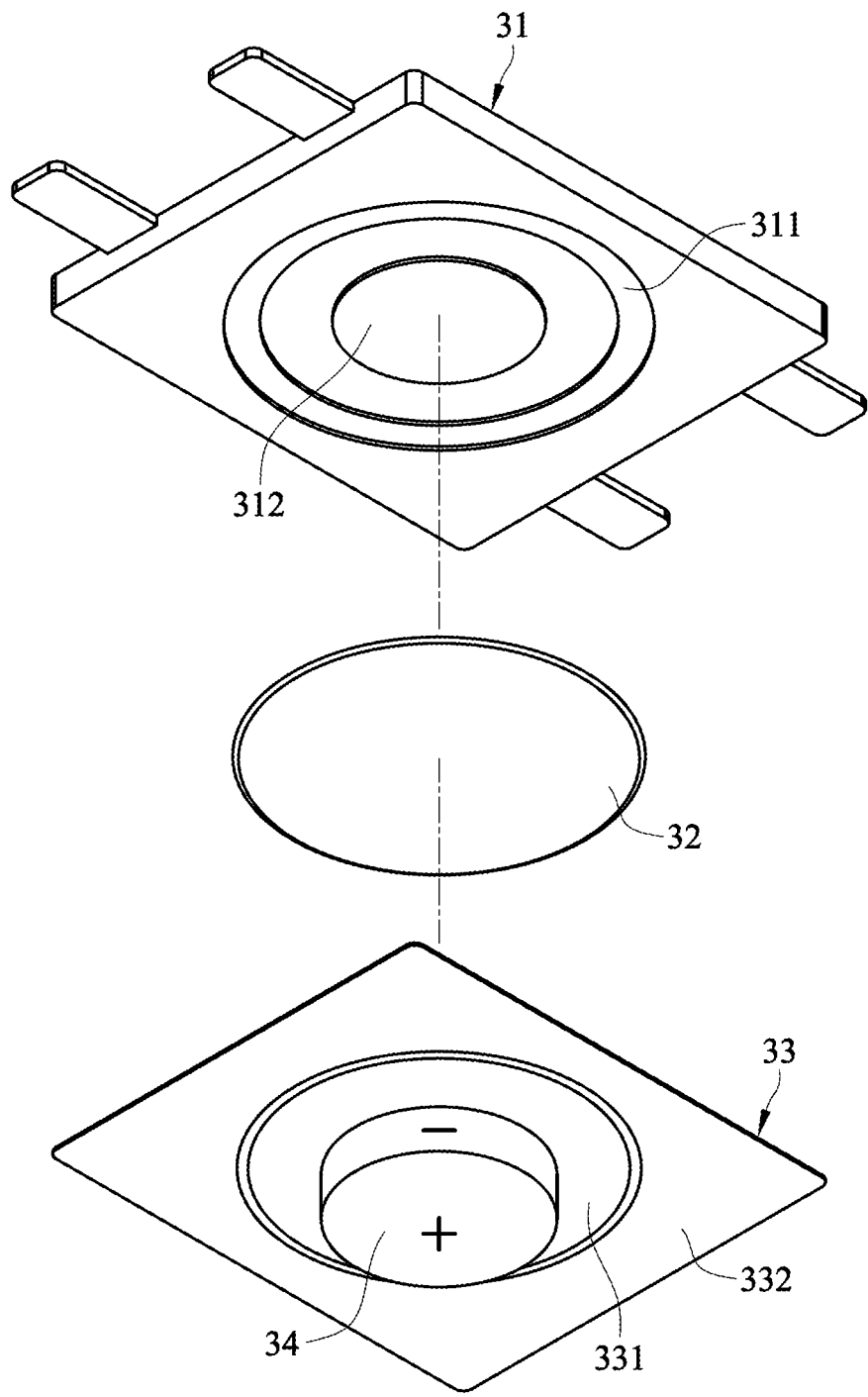
FIG. 2B is a schematic exploded view illustrating the switching module of the touchpad module according to the embodiment of the present invention.

Please refer to FIGS. 2A and 2B. FIG. 2A is a schematic perspective view illustrating a switching module of the touchpad module according to the embodiment of the present invention. FIG. 2B is a schematic exploded view illustrating the switching module of the touchpad module according to the embodiment of the present invention. The switch member 30 comprises a switch element 31, an elastic element 32, a protective layer 33 and a first magnetic element 34. A first surface of the switch element 31 is installed on the bottom surface of the circuit board 21 through a surface-mount technology (SMT). A second surface of the switch element 31 is opposed to the first surface of the switch element 31. An accommodation space 311 is formed in the second surface of the switch element 31. A switch contact point 312 is located at a middle region of the accommodation space 311. The elastic element 32 is disposed within the accommodation space 311 of the switch element 31. Moreover, the elastic element 32 is aligned with the switch contact point 312 within the accommodation space 311. An example of the elastic element 32 includes but is not limited to a metal dome or a rubber dome.

An example of the protective layer 33 is a Mylar film. The elastic element 32 and the switch element 31 are covered and protected by the protective layer 33. Consequently, the possibility of causing abrasion of the elastic element 32 and the switch element 31 will be reduced. In an embodiment, the protective layer 33 comprises a first covering part 331 and a second covering part 332, which are connected with each other. The first covering part 331 is used for covering the elastic element 32. The second covering part 332 is used for covering a portion of the switch element 31. The protective layer 33 has a first surface and a second surface, which are opposed to each other. The elastic element 32 is covered by the first surface of the protective layer 33. The first magnetic element 34 is also a permanent magnet. Moreover, the first magnetic element 34 is disposed on the second surface of the protective layer 33.

Please refer to FIGS. 1 and 2A again. The first magnetic element 34 of the switch member 30 is aligned with the second magnetic element 402 of the adjusting element 40. The like poles of the first magnetic element 34 and the second magnetic element 402 face each other. For example, the positive pole of the first magnetic element 34 faces the positive pole of the second magnetic element 402, or the negative pole of the first magnetic element 34 faces the negative pole of the second magnetic element 402. Consequently, when the first magnetic element 34 and the second magnetic element 402 are close to each other, a repulsive force is generated.

While the touch member 20 is pressed through the covering plate 22, the first magnetic element 34 of the switch member 30 is moved in the direction toward the second magnetic element 402 of the adjusting element 40. When the repulsive force between the first magnetic element 34 and the second magnetic element 402 is larger than the elastic force of the elastic element 32 of the switch member 30 (see FIG. 2B), the elastic element 32 is subjected to deformation to push the switch contact point 312. Consequently, the switch member 30 generates a corresponding triggering signal.

In some situations, the gap d between the top surface of the covering plate 22 and the top surface of the top cover 11 is subjected to a change because of the tolerance about the stack structure of the circuit board 21, the covering plate 22 and the pressure sensitive adhesive layer G Under this circumstance, it is necessary to calibrate the touchpad module. For example, a calibration tool (not shown) such as a screwdriver is locked into the driving recess 4012 of the driving body 401. As the driving body 401 is rotated by using the calibration tool, the position of the adjusting element 40 is correspondingly adjusted. As the adjusting element 40 is adjusted, the adjusting element 40 is moved relative to the base plate 12. For example, if the driving body 401 is rotated in the counterclockwise direction by using the calibration tool, the second magnetic element 402 is moved in the direction away from the first magnetic element 34. Consequently, the distance between the first magnetic element 34 and the second magnetic element 402 is increased. While the touch member 20 is pressed, the distance of the switch member 30 should be increased to allow the repulsive force between the first magnetic element 34 and the second magnetic element 402 to be larger than the elastic force of the elastic element 32 of the switch member 30. In other words, the travelling distance of the touch member 20 is increased. Whereas, if the driving body 401 is rotated in the clockwise direction by using the calibration tool, the second magnetic element 402 is moved in the direction away the first magnetic element 34. Consequently, the distance between the first magnetic element 34 and the second magnetic element 402 is decreased. While the touch member 20 is pressed, the distance of the switch member 30 is decreased to allow the repulsive force between the first magnetic element 34 and the second magnetic element 402 to be larger than the elastic force of the elastic element 32 of the switch member 30. In other words, the travelling distance of the touch member 20 is shortened.

In comparison with the conventional technology, the touchpad module of the present invention is capable of adjusting the travelling distance of the touch member through the repulsive force between the first magnetic element of the switch member and the second magnetic element of the adjusting element. Since the travelling distance of the touch member is adjusted, the tolerance about the stack structure of the touch member is calibrated. That is, the travelling distance of the touch member is not influenced by the tolerance of the stack structure of the touch member. Moreover, while the touch member is pressed, the switch member is compressed and subjected to deformation in response to the non-contact repulsive force between the magnetic elements. When compared with the conventional technology of using the contact-type external force to push the switch member, the action of the switch member in response to non-contact repulsive force can reduce the abrasion of the switch member and extend the use life of the switch member. In other words, the technology of the present invention is industrially valuable.

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims which are to be accorded with the broadest interpretation so as to encompass all modifications and similar structures.

What is claimed is:

1. A touchpad module for an electronic device, the touchpad module comprising:
   a fixing frame comprising a top cover and a base plate, wherein the top cover has an opening, the base plate is located under the top cover and connected with the top cover, and the base plate has an adjusting hole;
   a touch member movably installed within the opening of the top cover;
   a switch member installed on a bottom surface of the touch member, wherein the switch member comprises a first magnetic element; and
   an adjusting element accommodated within the adjusting hole of the base plate, wherein the adjusting element comprises a second magnetic element corresponding to the first magnetic element, and like poles of the first magnetic element and the second magnetic element face each other,
   wherein while the adjusting element is adjusted, the adjusting element is moved relative to the base plate, so that a travelling distance of the touch member is adjusted according to a repulsive force between the first magnetic element and the second magnetic element.

2. The touchpad module according to claim 1, wherein the touch member comprises a circuit board and a covering plate, and the covering plate is located over the circuit board.

3. The touchpad module according to claim 2, wherein an orthogonal projection area of the circuit board is larger than an orthogonal projection area of the covering plate, and a periphery region of a top surface of the circuit board is contacted with a bottom surface of the top cover.

4. The touchpad module according to claim 2, wherein the switch member comprises:
   a switch element installed on a bottom surface of the circuit board through a surface-mount technology, wherein the switch element comprises a switch contact point;
   an elastic element disposed on the switch element, and aligned with the switch contact point; and
   a protective layer having a first surface and a second surface, which are opposed to each other, wherein the elastic element and the switch element are covered by the first surface of the protective layer, and the first magnetic element is disposed on the second surface of the protective layer.

5. The touchpad module according to claim 4, wherein the switch element further comprises an accommodation space, wherein the elastic element is disposed within the accommodation space, and the switch contact point is located at a middle region of the accommodation space.

6. The touchpad module according to claim 4, wherein the elastic element is a metal dome or a rubber dome.

7. The touchpad module according to claim 4, wherein the protective layer comprises a first covering part and a second covering part, which are connected with each other, wherein the elastic element is covered by the first covering part, and a portion of the switch element is covered by the second covering part.

8. The touchpad module according to claim 1, wherein the adjusting element comprises a driving body, and the driving body is inserted into the adjusting hole, wherein a first end of the driving body is located near the switch member, and the second magnetic element is installed on the first end of the driving body.

9. The touchpad module according to claim 8, wherein the driving body has an external thread structure, and the adjusting hole has an inner thread structure corresponding to the external thread structure, wherein the driving body is rotatable relative to the base plate through the external thread structure and the inner thread structure.

10. The touchpad module according to claim 9, wherein the driving body further comprises a driving recess, and the driving recess is formed in a second end of the driving body, wherein the second end of the driving body is opposed to the first end of the driving body.

11. The touchpad module according to claim 1, wherein the first magnetic element and the second magnetic element are permanent magnets.

12. The touchpad module according to claim 1, wherein the electronic device is a notebook computer, a keyboard, a smart phone, a personal digital assistant, a writing tablet or a graphics tablet.

\* \* \* \* \*